US012124781B2

(12) United States Patent
Zhu

(10) Patent No.: US 12,124,781 B2
(45) Date of Patent: Oct. 22, 2024

(54) METHOD AND APPARATUS OF COMPILING VERIFICATION SYSTEM

(71) Applicant: XEPIC CORPORATION LIMITED, Nanjing (CN)

(72) Inventor: Jiahua Zhu, Hopkinton, MA (US)

(73) Assignee: XEPIC CORPORATION LIMITED, Nanjing (CN)

( * ) Notice: Subject to any disclaimer, the term of this patent is extended or adjusted under 35 U.S.C. 154(b) by 485 days.

(21) Appl. No.: 17/690,776

(22) Filed: Mar. 9, 2022

(65) Prior Publication Data

US 2023/0252209 A1 Aug. 10, 2023

(30) Foreign Application Priority Data

Feb. 9, 2022 (CN) .......................... 202210122435.8

(51) Int. Cl.
*G06F 30/33* (2020.01)
*G06F 30/337* (2020.01)
*G06F 30/34* (2020.01)
*G06F 30/367* (2020.01)
*G06F 30/398* (2020.01)

(52) U.S. Cl.
CPC ............ *G06F 30/33* (2020.01); *G06F 30/337* (2020.01); *G06F 30/34* (2020.01); *G06F 30/367* (2020.01); *G06F 30/398* (2020.01)

(58) Field of Classification Search
CPC ........ G06F 30/33; G06F 30/337; G06F 30/34; G06F 30/367; G06F 30/398
USPC ........... 716/106, 103, 104, 116, 132; 703/15
See application file for complete search history.

(56) References Cited

U.S. PATENT DOCUMENTS

| 7,966,610 | B2* | 6/2011 | Lin .......................... G06F 8/35 |
| | | | 717/152 |
| 9,063,765 | B2* | 6/2015 | Fallows .............. G06F 9/45516 |
| 11,893,386 | B1* | 2/2024 | Hogan ...................... G06F 8/53 |
| 2013/0031536 | A1* | 1/2013 | De .......................... G06F 8/427 |
| | | | 717/146 |

FOREIGN PATENT DOCUMENTS

| KR | 20100057495 A * | 5/2010 | ............. G06F 8/447 |
| WO | WO-2010058981 A2 * | 5/2010 | ......... G06F 17/5045 |

OTHER PUBLICATIONS

Zhang, Chinese Patent Document No. CN-112232003-A, published Jan. 15, 2021, 3 pages including abstract. (Year: 2021).*

* cited by examiner

*Primary Examiner* — Phallaka Kik
(74) *Attorney, Agent, or Firm* — ANOVA LAW GROUP, PLLC

(57) ABSTRACT

A method of compiling a verification system including a logic system design and a test bench for verifying the logic system design includes: receiving a description of the verification system, parsing the description of the verification system using a first parser and a second parser to generate a first intermediate representation (IR) and a second IR, respectively; analyzing the first and second IRs to generate exchange information; optimizing at least one of the first IR or the second IR based on the exchange information; and generating a first implementable code and a second implementable code respectively based on the first and second IRs after the optimization, wherein the first and second IRs are related by a connection point, and the exchange information is associated with the connection point.

19 Claims, 7 Drawing Sheets

METHOD AND APPARATUS OF COMPILING VERIFICATION SYSTEM

CROSS REFERENCE TO RELATED APPLICATION

This application claims priority to Chinese Patent Application No. 202210122435.8 filed Feb. 9, 2022, which is incorporated herein by reference in its entirety.

TECHNICAL FIELD

The present disclosure relates to the technical field of integrated circuit (IC) chip design verification and, more particularly, to a method and an apparatus of compiling a verification system including a logic system design and a test bench for verifying the logic system design.

BACKGROUND

In a logic system design process, the logic system design is often verified by running a hardware description code of the logic system design on a plurality of field programmable gate arrays (FPGAs) to emulate the logic system design, and running a software programming code of a test bench with stimuli on a central processing unit (CPU) to verify the logic system design. Generally, the hardware description code and the software programming code are compiled separately without optimization across one or more connection points between the hardware description code and the software programming code. Sometimes, the one or more connection points are between different hardware description codes and/or between different software programming codes. As a result, there may be redundant logics and a lot of run-time data exchange between a hardware emulation device emulating the logic system design and a CPU running a test bench with stimuli.

SUMMARY

In accordance with the disclosure, there is provided a method of compiling a verification system including a logic system design and a test bench for verifying the logic system design. The method includes: receiving a description of the verification system, parsing the description of the verification system using a first parser and a second parser to generate a first intermediate representation (IR) and a second IR, respectively; analyzing the first and second IRs to generate exchange information; optimizing at least one of the first IR or the second IR based on the exchange information; and generating a first implementable code and a second implementable code respectively based on the first and second IRs after the optimization, wherein the first and second IRs are related by a connection point, and the exchange information is associated with the connection point.

Also in accordance with the disclosure, there is provided an apparatus for compiling a verification system including a logic system design and a test bench for verifying the logic system design. The apparatus includes a memory storing a computer program and a processor configured to access and execute the computer program to: receive a description of the verification system; parse the description of the verification system using a first parser and a second parser to generate a first intermediate representation (IR) and a second IR, respectively; analyze the first and second IRs to generate exchange information; optimize at least one of the first IR or the second IR based on the exchange information; and generate a first implementable code and a second implementable code respectively based on the first and second IRs after the optimization, wherein the first and second IRs are related by a connection point, and the exchange information is associated with the connection point.

Also in accordance with the disclosure, there is provided a non-transitory computer-readable storage medium storing a computer program that, when executed by a processor, causes the processor to perform a method of compiling a verification system including a logic system design and a test bench for verifying the logic system design. The method includes: receiving a description of the verification system, parsing the description of the verification system using a first parser and a second parser to generate a first intermediate representation (IR) and a second IR, respectively; analyzing the first and second IRs to generate exchange information; optimizing at least one of the first IR or the second IR based on the exchange information; and generating a first implementable code and a second implementable code respectively based on the first and second IRs after the optimization, wherein the first and second IRs are related by a connection point, and the exchange information is associated with the connection point.

DETAILED DESCRIPTION OF THE EMBODIMENTS

Figure 1A:
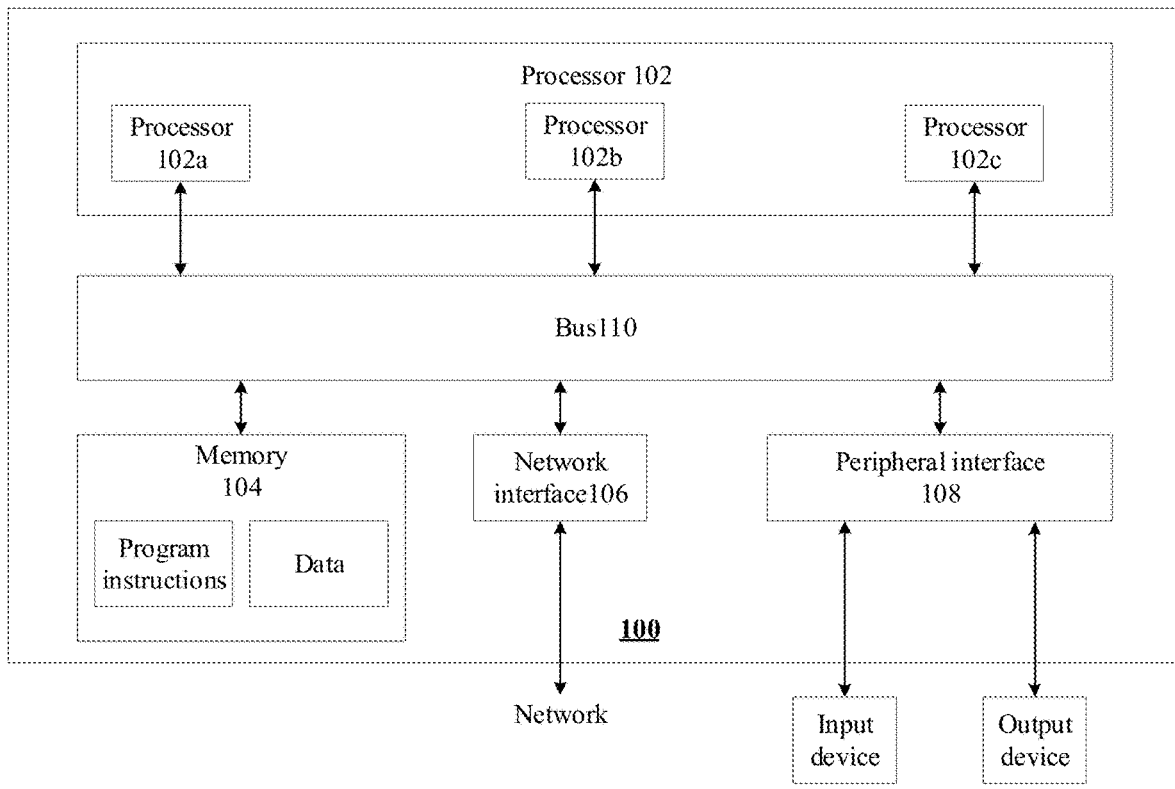
FIG. 1A illustrates a schematic structural diagram of an exemplary apparatus according to embodiments of the present disclosure.

Embodiments of the present disclosure are described in detail below with reference to the accompanying drawings. Same or similar reference numerals in the drawings represent the same or similar elements or elements having the same or similar functions throughout the specification. The described embodiments are some rather than all of the embodiments of the present disclosure. Other embodiments obtained by those having ordinary skills in the art on the basis of the described embodiments without inventive efforts should fall within the scope of the present disclosure. Unless there is conflict, the following embodiments and features of the embodiments can be combined with each other.

A logic system design (e.g., an integrated circuit chip design) needs to be verified before being finalized for production. The verification of the logic system design can be achieved by emulating the logic system design using one or more field programmable gate arrays (FPGAs). The emulation of the logic system design can include compiling hardware description language (HDL) codes of the logic system design into a gate-level netlist and implementing the gate-level netlist on the one or more FPGAs configured to mimic the logic system design. Running the emulated logic design system on the FPGAs can result in waveforms of the logic design system being generated for further verification.

FIG. 1A illustrates a schematic structural diagram of an exemplary apparatus 100 according to embodiments of the present disclosure. Apparatus 100 can be, for example, a host computer. Apparatus 100 can include: a processor 102, a memory 104, a network interface 106, a peripheral interface 108, and a bus 110. Processor 102, memory 104, network interface 106, and peripheral interface 108 can communicate with each other through bus 110 in apparatus 100.

Processor 102 can be a center processing unit (CPU), an image processor, a neural-network processing unit (NPU), a microcontroller unit (MCU), a programmable logical device, a digital signal processor (DSP), an application specific integrated circuit (ASIC), or one or more integrated circuits. Processor 102 can perform functions related to the technology described in the disclosure. In some embodiments, processor 102 can also include a plurality of processors integrated into a single logical component. As shown in FIG. 1A, processor 102 can include a plurality of processors 102a, 102b, and 102c.

Memory 104 can be configured to store data (e.g., an instruction set, computer codes, intermediate data). For example, as shown in FIG. 1A, the stored data can include program instructions (e.g., program instructions used to implement the technology of the disclosure) and data to be processed (e.g., memory 104 can store temporary codes generated during compiling). Processor 102 can also access stored program instructions and data, and execute the program instructions to operate the data to be processed. Memory 104 can include a non-transitory computer-readable storage medium, such as a volatile storage device or a non-volatile storage device. In some embodiments, memory 104 can include a random-access memory (RAM), a read-only memory (ROM), an optical disk, a magnetic disk, a hard disk, a solid state drive (SSD), a flash memory, a memory stick, and the like.

Network interface 106 can be configured to enable apparatus 100 to communicate with one or more other external devices via a network. The network can be any wired or wireless network capable of transmitting and/or receiving data. For example, the network can be a wired network, a local wireless network (e.g., a Bluetooth network, a WiFi network, a near field communication (NFC) network, and the like), a cellular network, the Internet, or a combination of any two or more of the above. The type of the network is not limited to the above specific examples. In some embodiments, network interface 106 can include any number of network interface controllers (NICs), radio frequency modules, receivers, modems, routers, gateways, adapters, cellular network chips, or random combinations of two or more of the above.

Peripheral interface 108 can be configured to connect apparatus 100 to one or more peripheral devices to implement inputting and outputting of information. For example, a peripheral device can include an input device, such as a keyboard, a mouse, a touch panel, a touch screen, a microphone, or a sensor, or an output device, such as a display, a speaker, a vibrator, or an indicator light.

Bus 110 can be configured to transmit information among various components (e.g., processor 102, memory 104, network interface 106, and peripheral interface 108) of apparatus 100, and can be, for example, an internal bus (e.g., a processor-storage bus), an external bus (a USB port, a PCI-E bus), and the like.

In some embodiments, in addition to processor 102, memory 104, network interface 106, peripheral interface 108, and bus 110 shown in FIG. 1A and described above, apparatus 100 can also include one or more other components needed for normal operations, and/or one or more other components necessary to implement the solutions of embodiments of the present disclosure. In some embodiments, apparatus 100 may not include one or more components shown in FIG. 1A.

Figure 1B:
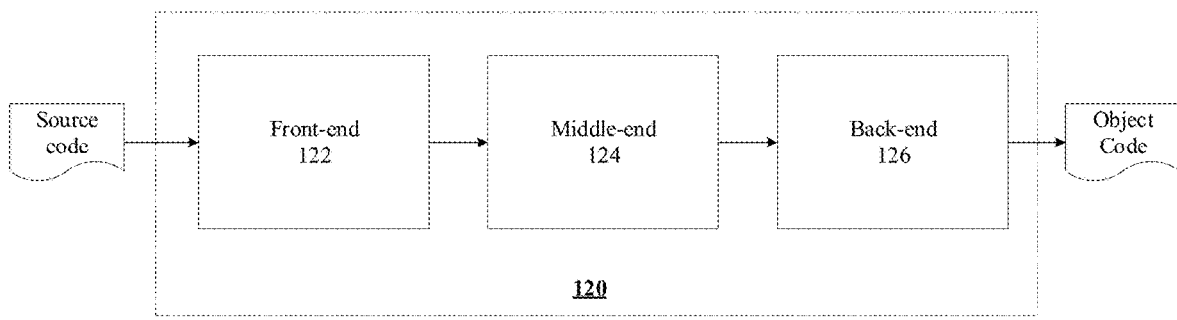
FIG. 1B illustrates a schematic diagram of an exemplary compiler.

FIG. 1B illustrates a schematic diagram of an exemplary compiler 120.

Compiler 120 can generate object codes based on computer codes of a design, which are to be compiled. The computer codes of a design can also be referred to as source codes. Generally, a source language for compiling the source codes can be a high-level programming language. The high-level programming language can be, for example, a software programming language, such as C++ or Java, or a hardware description language, such as VHDL, Verilog, or SystemVerilog. The object codes can be, for example, assembly codes, machine codes, and the like. In some embodiments of the present disclosure, the object codes are described by taking the machine codes as an example. In some other embodiments, the machine codes may be replaced with another type of object codes.

Compiler 120, for example, can be stored in memory 104 shown in FIG. 1A and be executed by processor 102.

As shown in FIG. 1B, compiler 120 can include a front-end 122, a middle-end 124, and a back-end 126.

Front-end 122 can be used to analyze lexing, grammar, and semantics of the source codes according to a specific source code language.

After front-end 122 completes the analysis of the lexing, grammar and semantics of the source codes, middle-end 124 can convert the source codes into intermediate representations ("IRs," also referred to as "intermediate codes"), and can optimize the intermediate representations. For example, middle-end 124 can remove useless codes, remove inaccessible codes, clear unused variables, and the like. The optimization can include machine-related optimization and/or machine-independent optimization.

In some embodiments, front-end 122 and middle-end 124 can be collectively referred to as a parser.

The intermediate representations (IRs) generated by a parser can be transferred to back-end 126 for further processing.

Back-end 126 can further optimize the intermediate representations according to the architecture of a target processor (e.g., processor 102 of FIG. 1A), and generate object codes. Generally, the object codes can be machine codes when the design is software, and the object codes can be a bit stream, or the like, when the design is hardware. The bit stream can be implemented on e.g., an FPGA, for emulating the design.

The machine codes and the bit stream can also be referred to as implementable codes. Generally, any codes generated before the implementable codes can be referred to as the IR.

The structure of a compiler is not limited to the example shown in FIG. 1B. For example, middle-end 124 alone can be referred to as a parser in some cases.

Figure 2:
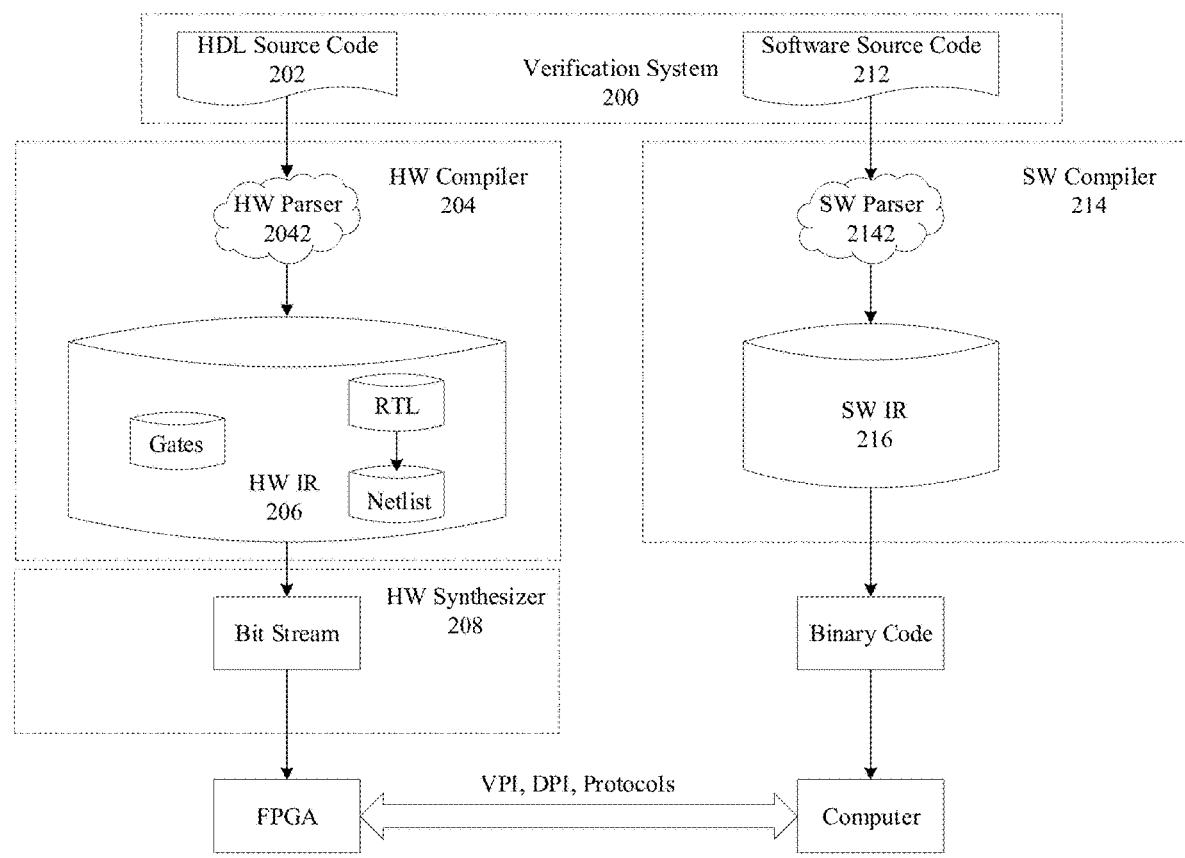
FIG. 2 is a schematic diagram showing a process of compiling a verification system.

FIG. 2 is a schematic diagram showing a process of compiling a verification system. A verification system 200 can be used to verify an integrated circuit (IC) design, and can include an HDL source code 202 of the IC design and a software source code 212 of a verification environment (also known as a test bench (TB)).

Consistent with the disclosure, the IC design can be captured in an HDL source code, which can be written in a hardware description language (HDL), such as Verilog, SystemVerilog, or very high-speed integrated circuit hardware description language (VHDL). The integrated circuit can be, e.g., a very large-scale integration (VLSI) device. The HDL source code can be compiled by a hardware compiler 204 to generate a flat netlist to be implemented on a simulator or a hardware emulation device. The hardware emulation device can include one or more FPGAs. Hardware compiler 204 can include a parser 2042 for processing the HDL source code and generate hardware IR 206. Hardware IR 206 can include gate level description, register transaction level (RTL) code, or the like. Hardware compiler 204 can further compile the RTL code into a netlist, as part of hardware IR 206. Hardware synthesizer 208 can further synthesize hardware IR 206 and generate bit stream, which can be implemented on an FPGA of the emulation device.

Further, a test bench (TB) for providing stimuli can be captured in a software source code 212 written in a software programming language, such as C, C++, or Python. The software source code 212 can be compiled by a software compiler 214 to generate a binary executable code to be executed by a central processing unit (CPU). As discussed above with reference to FIG. 1B, software compiler 214 can include a parser (such as a parser 2142 shown in FIG. 2) for processing the software source code 212 and generate software IR 216. Software compiler 214 can further compile software IR 216 and generate binary code for execution on a computer.

In some embodiments, the test bench can be described in an HDL, such as SystemVerilog, instead of being written in a software programming language.

As an example, an emulation system can include a host computer and a hardware emulation device connected to the host computer. The IC design can be compiled by the hardware compiler and executed on the hardware emulation device, and the test bench can be compiler by the software compiler and executed on the host computer to, e.g., display intermediate or final results of the execution of the IC design.

The IC design emulated on an FPGA can interact with the test bench through, e.g., direct programming interface (DPI) calls. The test bench can interact with the IC design through, e.g., Verilog procedural interface (VPI) calls. The DPI calls are used to interface SystemVerilog with foreign languages (e.g., C, C++ languages), and the VPI calls are used to interface Verilog with C language. In addition to the VPI calls and DPI calls, some hardware and software protocols can be also used to implement communications between the emulation device and a host computer executing the binary executable code. The communications between the emulation device and the host computer implemented by the DPI calls, the VPI calls, and the protocols can involve substantial overhead, and slow down the emulation of verification system 200.

Figure 3:
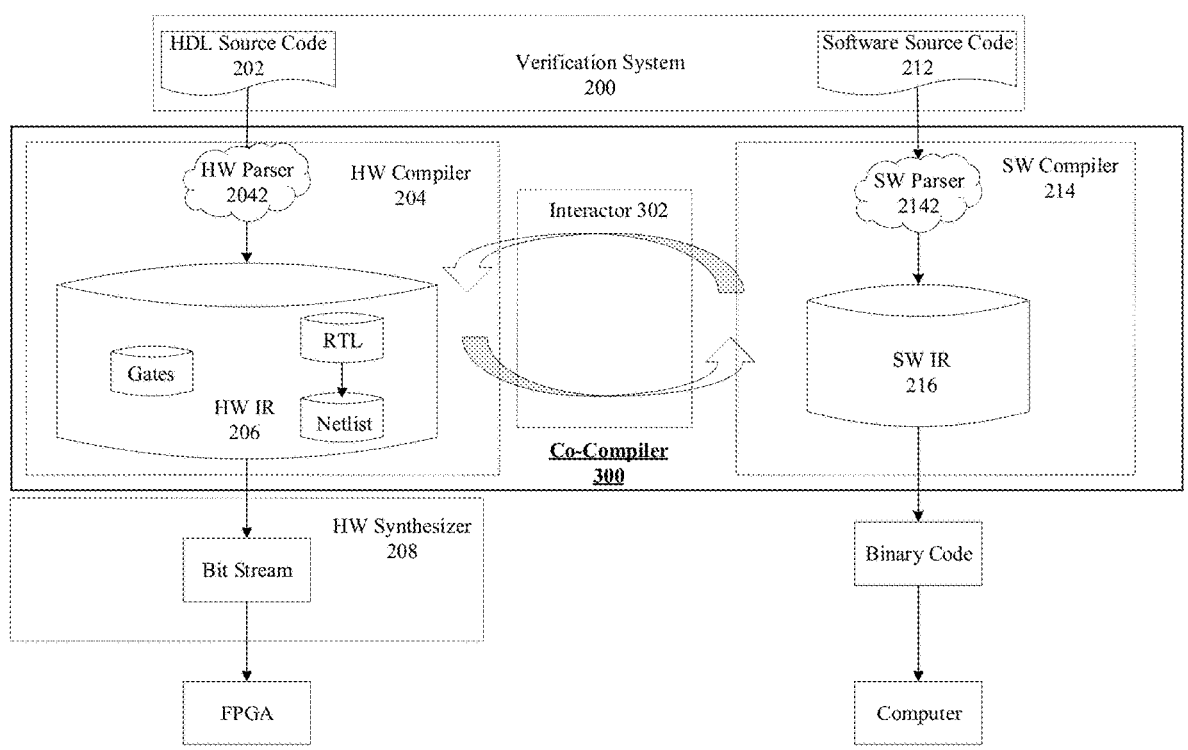
FIG. 3 is a schematic diagram showing an exemplary process of compiling a verification system according to embodiments of the present disclosure.

FIG. 3 is a schematic diagram showing an exemplary process of compiling a verification system according to embodiments of the present disclosure.

Different from the process of FIG. 2, where two separate compilers respectively compile the HDL source code 202 and the software source code 212, the exemplary process of FIG. 3 introduces a co-compiler 300 to process both the HDL source code 202 and the software source code 212. More specifically, in addition to hardware compiler 204 and software compiler 214 of FIG. 2, co-compiler 300 can include an interactor 302 for optimizing the IRs 206 and 216 generated by hardware parser 2042 and software parser 2142.

In some embodiments, interactor 302 can analyze IR 206 and IR 216 to obtain one or more connection points.

Figure 4A:
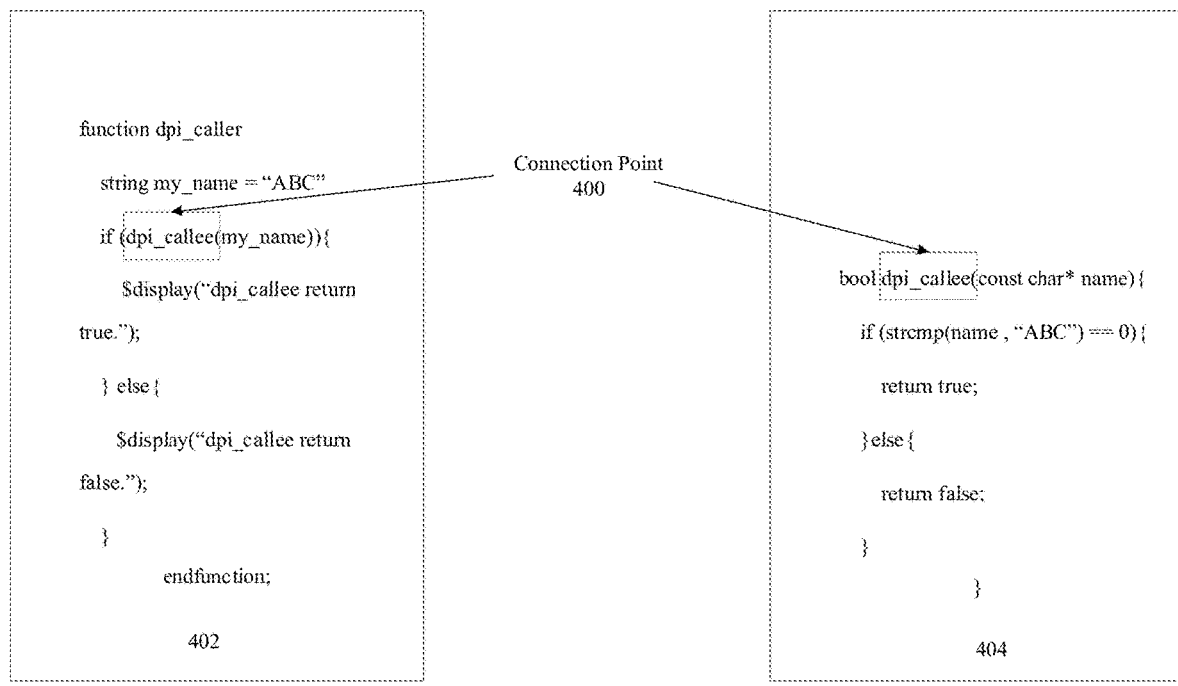
FIG. 4A illustrates an exemplary connection point between two intermediate representations (IRs) according to embodiments of the disclosure.

FIG. 4A illustrates an exemplary connection point 400 between two IRs according to embodiments of the disclosure. Because an IR always corresponds to the source code, FIG. 4A shows the source code instead of IR for better clarity.

In FIG. 4A, IR 402 is part of a hardware IR, and IR 404 is part of a software IR. IR 402 describes a Verilog function "dpi_caller(my_name)", in which a Boolean function "dpi_callee(const char* name)" is called as a condition in the "if" statement. The Boolean function "dpi_callee(const char* name)" is defined in IR 404. Therefore, the Boolean function "dpi_callee(const char* name)" along with the variable "name" can be determined as a connection point 400 between IRs 402 and 404. In a conventional compilation process, IRs 402 and 404 are processed separately into object codes. That is, a boundary exists between the HDL source code 202 of the IC design and the software source code 212 of the test bench. In contrast, consistent with the present disclosure, co-compiler 300 can further optimize IRs 402 and 404 based on connection point 400.

Co-compiler 300 can break down the boundary between HDL source code 202 of the IC design and software source code 212 of the test bench. During compiling time, information related to connection point 400 can be obtained by co-compiler 300 for further optimization, resulting in functions of HDL source code 202 of the IC design and software source code 212 of the test bench being moved across the boundary for execution by either the FPGAs or the CPU. As a result, run-time performance is optimized.

In one embodiment, in the example of FIG. 4A, connection point 400 includes the Boolean function "dpi_callee (const char* name)" and the variable "name". By analyzing IRs 402 and 404, it is determined that the variable "name" is a constant "ABC" and the return value of the Boolean function "dpi_callee(const char* name)" is always true. Thus, IR 404 can be removed and IR 402 can be optimized into following code:

```
function dpi_caller
    $display("dpi_callee return true");
endfunction
```

Figure 4B:
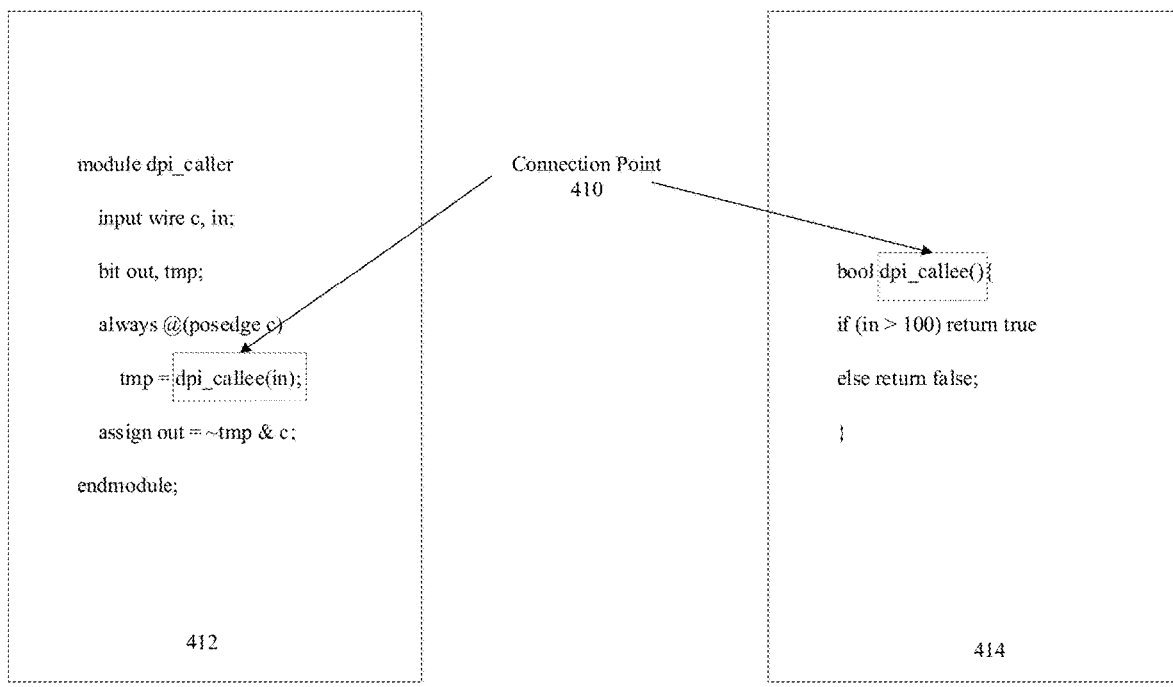
FIG. 4B illustrates another exemplary connection point between two IRs according to embodiments of the disclosure.

FIG. 4B illustrates another exemplary connection point 410 between two IRs according to embodiments of the disclosure.

Similarly, the Boolean function "dpi_callee(in)" along with the variable "in" can be determined as a connection point 410 between IRs 412 and 414.

In the conventional process, a hardware compiler can determine that signal "out" drives nothing and can eliminate the statement "assign out=~tmp & x". However, regarding the statement "tmp=dpi_callee(in)", the conventional hardware compiler cannot further optimize this statement without enough information of the function "dpi_callee(in)".

In one embodiment, in the example of FIG. 4B, connection point 410 includes the Boolean function "dpi_callee (in)" and the variable "in". By analyzing IRs 412 and 414, it is determined that dpi_callee(in) also drives nothing. Thus, the module "dpi_caller" is a loadless module, and IR 412 of the module "dpi_caller" can be removed.

Figure 4C:
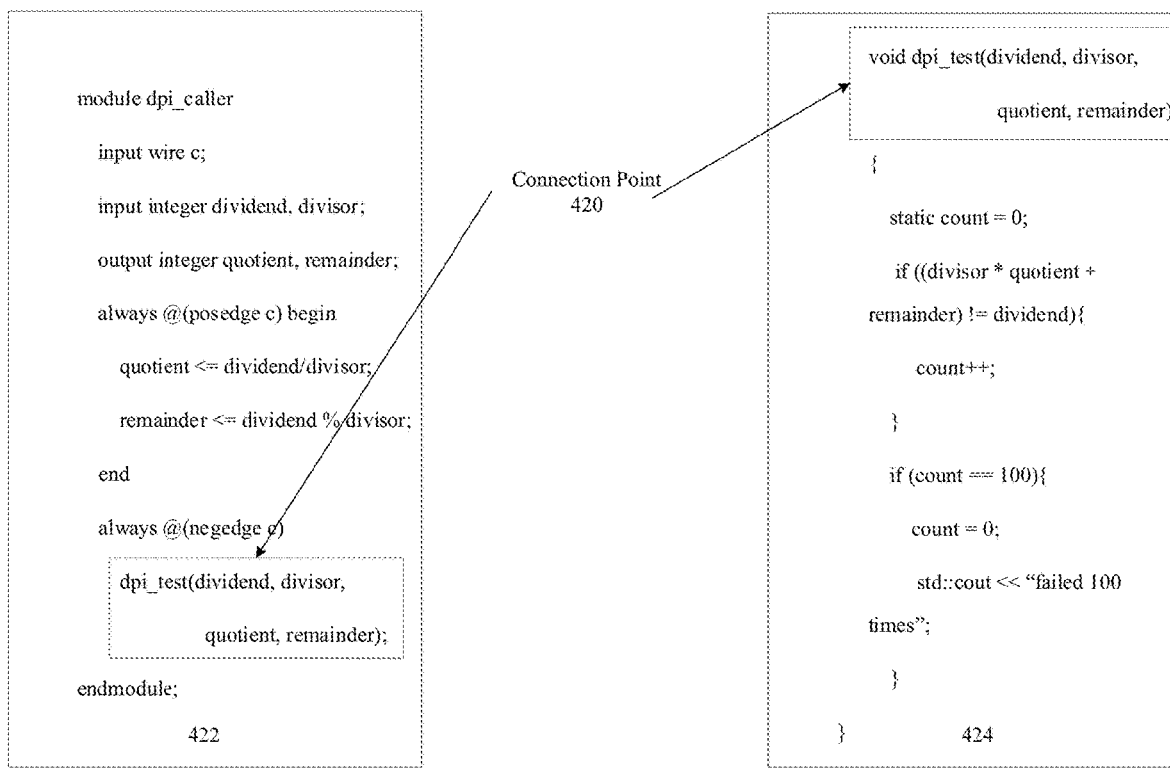
FIG. 4C illustrates yet another exemplary connection point between two IRs according to embodiments of the disclosure.

FIG. 4C illustrates yet another exemplary connection point 420 between two IRs according to embodiments of the disclosure.

Similarly, the function "dpi_test(dividend, divisor, quotient, remainder)" can be determined as a connection point 420 between IRs 422 and 424.

In the conventional process, no optimization can be applied to IRs 422 and 424 at all. However, co-complier 300 according to embodiments of the disclosure can optimize IRs 422 and 424, as described in more detail below.

In one embodiment, by analyzing IRs 422 and 424, co-complier 300 can discover that most code of the function "dpi_test(dividend, divisor, quotient, remainder)" in IR 424 is synthesizable. For example, the function dpi_test( ) includes two "if" statements, and the first "if" statement is directed to incrementing a variable "count" under a given condition and is synthesizable. Thus, the synthesizable part of IR 424 can be moved from IR 424 to IR 422. For example, the synthesizable part of IR 424 can be converted to a format of IR 422, and then be moved into IR 422. Accordingly, IR 422 and the synthesizable part of IR 424 can be optimized together as a hardware design, and only software function is left in IR 424. Such an optimization can significantly reduce communication between the emulation device implementing IR 422 and the host computer running IR 424.

Figure 5:
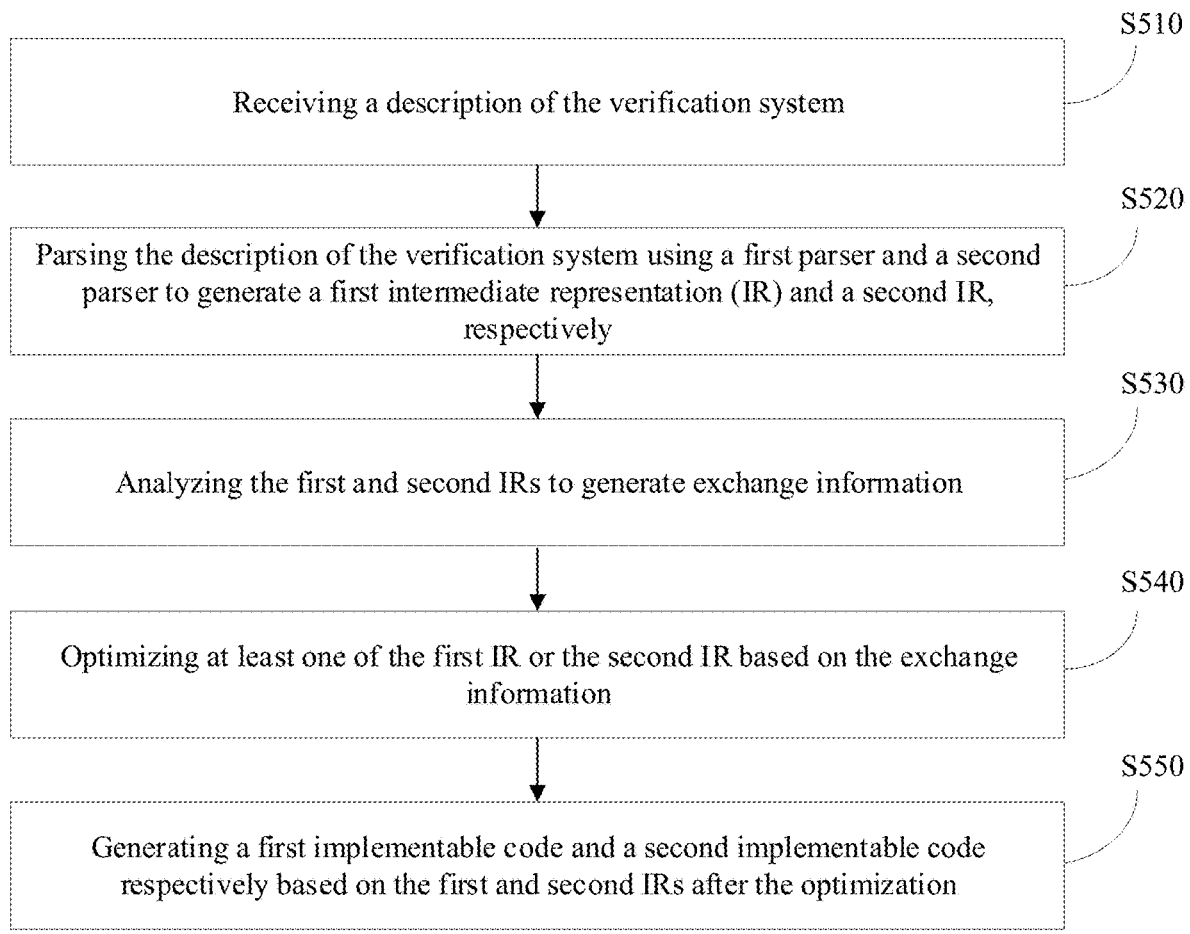
FIG. 5 is a flowchart of an exemplary method for compiling a verification system according to embodiments of the present disclosure.

FIG. 5 is flowchart of an exemplary method 500 for compiling a verification system according to embodiments of the present disclosure. Method 500 can be performed by e.g., apparatus 100 of FIG. 1A, and include steps as below.

At S510, a description of the verification system (e.g., verification system 200 of FIGS. 2-3) can be received. The verification system includes a logic system design (e.g., an IC design) and a test bench for verifying the logic system. The description of the verification system includes a design description (e.g., HDL source code 202 of FIGS. 2-3) of the logic system design and a test description (e.g., software source code 204) of the test bench. The test description of the test bench includes a first source code in a software programming language. The design description of the logic system includes a second source code in a hardware description language (HDL). In some embodiments, the test bench can be described in HDL, such as SystemVerilog.

The HDL can include at least one of Verilog, SystemVerilog, or VHDL. The software programming language can include at least one of C, C++, Python, or the like.

At S520, the description of the verification system can be parsed using a first parser and a second parser to generate a first intermediate representation (IR) and a second IR, respectively. That is, a first parser (e.g., software parser 2142 of FIGS. 2-3) is used to parse the description of the verification system to obtain a first intermediate representation (IR) (e.g., software IR 216 of FIGS. 2-3) and a second parser (e.g., hardware parser 2042 of FIGS. 2-3) is used to parse the description of the verification system to obtain a second IR (e.g., hardware IR 206 of FIGS. 2-3). As discussed above, the second IR can include gate level description, RTL code, or the like. The RTL code can be further synthesized into implementable code (e.g., bit stream).

In some embodiments, the first parser is configured to parse a software programming language. The second parser is configured to parse the HDL. In some embodiments, the first IR is generated based on the test description of the test bench, and the second IR is generated based on the design description of the logic system design.

In some embodiments, the first parser is configured to parse a third source code in one of C, C++, and Python to obtain the first IR. The second parser is configured to parse a fourth source code in another one of C, C++, and Python to obtain the second IR. The software programming language of the third source code and the software programming language of the fourth source code are different. In other words, the present disclosure is not only applicable to compilation optimization between a source code in the software programming language and a source code in the HDL, but also applicable to compilation optimization between two source codes in two different software programming languages.

In some embodiments, the first parser is configured to parse a fifth source code in one of Verilog, SystemVerilog, and VHDL to obtain the first IR. The second parser is configured to parse a sixth source code in another one of Verilog, SystemVerilog, and VHDL to obtain the second IR. The HDL of the fifth source code and the HDL of the sixth source code are different. In other words, the present disclosure is not only applicable to compilation optimization between a source code in the software programming language and a source code in the HDL, but also applicable to compilation optimization between two source codes in two different HDLs.

Returning to FIG. 5, at S530, the first and second IRs can be analyzed to generate exchange information. The first and second IRs are related by a connection point, and the exchange information is associated with the connection point.

In some embodiments, the connection point can be a function. As used in the present disclosure, a function can include a module, a block, a Universal Verification Methodology (UVM) component in HDL, or a software function in software programming language. The first parser is configured to parse a software programming language, and the second parser is configured to parse a hardware description language. The function can be defined in the first IR and called in the second IR. For example, in FIG. 4A, the function dpi_callee( ) is determined as connection point 400, and is defined in IR 404 and called in IR 402.

The exchange information can include a description of the function. For example, the exchange information can include the "if" statement of the function dpi_callee( ). In some embodiments, co-compiler 300 can process the description of the function and generate additional exchange information. For example, the exchange information can further include an execution result of the function (e.g., FIG. 4A), information regarding whether a load is driven in the function (e.g., FIG. 4B), part of the IR (e.g., FIG. 4C), and the like. Therefore, a boundary between two IRs can be broken and further optimization can be applied to both IRs.

At S540, at least one of the first IR or the second IR can be optimized based on the exchange information. Compilation optimization is intended to reduce or eliminate one or more connection points that exchange information during run-time, and improve the run-time performance.

In some embodiments, whether the function in the first IR generates a constant can be determined according to the exchange information, and a part of the second IR that is driven by the constant can be simplified. As discussed above with reference to FIG. 4A, it can be determined that the function dpi_callee( ) generates a constant "true," and thus IR 402 can be simplified (e.g., the part of the second IR can be eliminated).

In some embodiments, based on the exchange information, whether the function causes an output of a loadless module in the second IR to drive a load can be determined. In response to the function not causing the output of the loadless module to drive the load, the loadless module can be eliminated from the second IR during the optimization. For example, as discussed above with reference to FIG. 4B, dpi_callee(in) is connection point 410, and it is determined that dpi_callee(in) also drives nothing. Thus, the module "dpi_caller" is a loadless module, and IR 412 of the module "dpi_caller" can be removed.

In some embodiments, a synthesizable part and an unsynthesizable part of the function in the first IR can be identified. Then, the synthesizable part of the first IR can be converted from a format of the first IR to a format of the second IR and incorporated into the second IR. The second IR with the synthesizable part incorporated can be optimized. Accordingly, the synthesizable part can be removed from the first IR, and a first implementable code can be generated based on the first IR with the synthesizable part removed.

As discussed above with reference to FIG. 4C, the function dpi_test( ) of IR 424 includes a synthesizable part and an unsynthesizable part. The synthesizable part of IR 424 can be converted and incorporated into IR 422, so that the original IR 422 and the synthesizable part can be optimized together.

Returning to FIG. 5, at S550, a first implementable code and a second implementable code are generated respectively based on the first and second IRs after optimization. In some embodiments, the first implementable code is a binary machine code and the second implementable code is a bit stream.

In some embodiments, the optimized logic system design is compiled by a hardware compiler to obtain a flat netlist and then synthesized into a bit stream to run on a hardware emulation device, and the optimized test bench is compiled by a software compiler to obtain a binary executable code to run on a CPU of a computer.

In some embodiments, the binary executable code may be an X86 binary executable code for an X86 CPU or an ARM binary executable code for an ARM CPU.

Consistent with the present disclosure, the logic system design and the test bench are jointly compiled with the assistance of the exchange information generated by the connection point, so as to reduce run-time data exchange between the hardware emulation device emulating the IC design and the host computer running the test bench with the stimuli. Thus, IC design verification testing time is reduced.

The present disclosure also provides an apparatus of compiling a verification system. The apparatus can be apparatus 100 shown in FIG. 1A. Processor 102a can be configured to execute a computer program stored in memory 104 to implement a method of compiling a verification system consistent with the present disclosure, such as one of the exemplary methods described above (e.g., method 500 shown in FIG. 5). The detail description is omitted here.

The present disclosure also provides a non-transitory computer-readable storage medium. The non-transitory computer-readable storage medium stores a computer program. When being executed by a processor, the computer program causes the processor to implement a method of compiling a verification system consistent with the present disclosure, such as one of the exemplary methods described above (e.g., method 500 shown in FIG. 5). The description thereof is omitted.

The non-transitory computer-readable storage medium may be an internal storage unit of the apparatus described in any of the foregoing embodiments. For example, the non-transitory computer-readable storage medium may be a hard disk or an internal memory of the apparatus. The non-transitory computer-readable storage medium may also be an external storage device of the apparatus, such as a plug-in hard disk, a smart media card (SMC), a secure digital (SD) card, a flash card, etc. Further, the non-transitory computer-readable storage medium may also include an internal storage unit and an external storage device. The non-transitory computer-readable storage medium may also store the computer program, and other programs and data needed by the apparatus. The non-transitory computer-readable storage medium may also temporarily store outputted data or to-be-outputted data.

A person of ordinary skill in the art may understand that all or part of the processes in the above-described method embodiments may be implemented by instructing relevant hardware through a computer program. The computer program may be stored in a computer-readable storage medium. When being executed, the computer program may cause the execution of the processes of the above-described method embodiments. The computer-readable storage medium may be a magnetic disk, an optical disk, a read-only memory (ROM), or a random-access memory (RAM).

Other embodiments of the disclosure will be apparent to those skilled in the art from consideration of the specification and practice of the embodiments disclosed herein. It is intended that the specification and examples be considered as exemplary only and not to limit the scope of the disclosure, with a true scope and spirit of the invention being indicated by the following claims.

What is claimed is:

1. A method of compiling a verification system, the verification system including a logic system design and a test bench for verifying the logic system design, the method comprising:
receiving a description of the verification system;
parsing the description of the verification system using a first parser and a second parser to generate a first intermediate representation (IR) and a second IR, respectively;
analyzing the first and second IRs to generate exchange information;
optimizing at least one of the first IR or the second IR based on the exchange information; and
generating a first implementable code and a second implementable code respectively based on the first and second IRs after the optimization, wherein the first and second IRs are related by a connection point, and the exchange information is associated with the connection point.

2. The method of claim 1, wherein the connection point is a function, the function is defined in the first IR and called in the second IR, and the exchange information includes a description of the function.

3. The method of claim 2, wherein optimizing at least one of the first IR or the second IR based on the exchange information further comprises:
determining whether the function in the first IR generates a constant according to the exchange information; and
simplifying a part of the second IR that is driven by the constant.

4. The method of claim 2, wherein optimizing at least one of the first IR or the second IR based on the exchange information further comprises:
based on the exchange information, determining whether the function causes an output of a loadless module in the second IR to drive a load; and
in response to the function not causing the output of the loadless module to drive the load, eliminating the loadless module from the second IR during the optimization.

5. The method of claim 2, wherein optimizing at least one of the first IR or the second IR based on the exchange information further comprises:
identifying a synthesizable part and an unsynthesizable part of the function in the first IR;
converting the synthesizable part of the first IR from a format of the first IR to a format of the second IR;
incorporating the synthesizable part into the second IR; and
optimizing the second IR with the incorporation of the synthesizable part.

6. The method of claim 5, further comprising:
removing the synthesizable part from the first IR;
wherein the first implementable code is a binary machine code and the second implementable code is a bit stream.

7. The method of claim 6, wherein the description of the verification system includes a design description of the logic system design and a test description of the test bench, the first IR is generated based on the test description of the test bench, and the second IR is generated based on the design description of the logic system design.

8. The method of claim 1, wherein the first parser is configured to parse a software programming language, and the second parser is configured to parse a hardware description language.

9. The method of claim 8, wherein:
the hardware description language includes at least one of Verilog, SystemVerilog, or very high-speed integrated circuit hardware description language (VHDL); and
the software programming language includes at least one of C, C++, or Python.

10. An apparatus for compiling a verification system, the verification system including a logic system design and a test bench for verifying the logic system design, the apparatus comprising:
a memory storing a computer program; and
a processor configured to execute the computer program to:
receive a description of the verification system;
parse the description of the verification system using a first parser and a second parser to generate a first intermediate representation (IR) and a second IR, respectively;
analyze the first and second IRs to generate exchange information;
optimize at least one of the first IR or the second IR based on the exchange information; and
generate a first implementable code and a second implementable code respectively based on the first and second IRs after the optimization, wherein the first and second IRs are related by a connection point, and the exchange information is associated with the connection point.

11. The apparatus of claim 10, wherein the connection point is a function, the function is defined in the first IR and called in the second IR, and the exchange information includes a description of the function.

12. The apparatus of claim 11, wherein the processor is further configured to execute the computer program to:
determine whether the function in the first IR generates a constant according to the exchange information; and
simplify a part of the second IR that is driven by the constant.

13. The apparatus of claim 11, wherein the processor is further configured to execute the computer program to:
based on the exchange information, determine whether the function causes an output of a loadless module in the second IR to drive a load; and
in response to the function not causing the output of the loadless module to drive the load, eliminate the loadless module from the second IR during the optimization.

14. The apparatus of claim 11, wherein the processor is further configured to execute the computer program to:
identify a synthesizable part and an unsynthesizable part of the function in the first IR;
convert the synthesizable part of the first IR from a format of the first IR to a format of the second IR;
incorporate the synthesizable part into the second IR; and
optimize the second IR with the incorporation of the synthesizable part.

15. The apparatus of claim 14, wherein:
the processor is further configured to execute the computer program to remove the synthesizable part from the first IR; and
the first implementable code is a binary machine code and the second implementable code is a bit stream.

16. The apparatus of claim 15, wherein the description of the verification system includes a design description of the logic system design and a test description of the test bench, the first IR is generated based on the test description of the test bench, and the second IR is generated based on the design description of the logic system design.

17. The apparatus of claim 10, wherein the first parser is configured to parse a software programming language, and the second parser is configured to parse a hardware description language.

18. The apparatus of claim 17, wherein:
the hardware description language includes at least one of Verilog, SystemVerilog, or very high-speed integrated circuit hardware description language (VHDL); and
the software programming language includes at least one of C, C++, or Python.

19. A non-transitory computer-readable storage medium storing a computer program that, when executed by a processor, causes the processor to perform a method of compiling a verification system, the verification system including a logic system design and a test bench for verifying the logic system design, the method comprising:
receiving a description of the verification system;
parsing the description of the verification system using a first parser and a second parser to generate a first intermediate representation (IR) and a second IR, respectively;
analyzing the first and second IRs to generate exchange information;
optimizing at least one of the first IR or the second IR based on the exchange information; and
generating a first implementable code and a second implementable code respectively based on the first and second IRs after the optimization, wherein the first and second IRs are related by a connection point, and the exchange information is associated with the connection point.

\* \* \* \* \*